(12) United States Patent
Suganaga

(10) Patent No.: US 9,711,344 B2
(45) Date of Patent: Jul. 18, 2017

(54) SEMICONDUCTOR DEVICE MANUFACTURING METHOD USING A MULTILAYER RESIST

(71) Applicant: Renesas Electronics Corporation, Koutou-ku, Tokyo (JP)

(72) Inventor: Toshifumi Suganaga, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/015,217

(22) Filed: Feb. 4, 2016

(65) Prior Publication Data

US 2016/0247684 A1 Aug. 25, 2016

(30) Foreign Application Priority Data

Feb. 24, 2015 (JP) ................. 2015-033930

(51) Int. Cl.
- *H01L 21/311* (2006.01)
- *H01L 21/02* (2006.01)
- *H01L 21/033* (2006.01)
- *H01L 21/3213* (2006.01)

(52) U.S. Cl.
CPC .... *H01L 21/02087* (2013.01); *H01L 21/0332* (2013.01); *H01L 21/31144* (2013.01); *H01L 21/32139* (2013.01)

(58) Field of Classification Search
CPC . H01L 21/20; H01L 21/203; H01L 21/28061; H01L 21/28194; H01L 21/28229; H01L 21/283; H01L 21/30655; H01L 21/31055; H01L 21/31111; H01L 21/31133; H01L 21/32133; H01L 21/76876; H01L 21/76879; H01L 2221/1031

USPC .................. 430/311, 326; 438/703, 952, 700
See application file for complete search history.

(56) References Cited

U.S. PATENT DOCUMENTS

| 8,178,983 B2 | 5/2012 | Ishibashi et al. |
| 2007/0128554 A1* | 6/2007 | Kawamura ........... G03F 7/2041 430/311 |
| 2007/0190462 A1* | 8/2007 | Shiobara ............... G03F 7/2041 430/311 |
| 2008/0241489 A1 | 10/2008 | Ishibashi et al. |

FOREIGN PATENT DOCUMENTS

| JP | 2008-277748 A | 11/2008 |
| JP | 4897056 B2 | 3/2012 |

OTHER PUBLICATIONS

Katsushi Nakano, et al., "Control and reduction of immersion defectively for yield enhancement at high volume production", Proc. of SPIE, 2009, pp. 72721P-1-72721P-9, vol. 7274.

Masafumi Fujita, et al., "Defectivity Improvement by Modified Wafer Edge Treatment in Immersion Lithography", Proc. of SPIE, 2009, pp. 72741G-1-72741G-10, vol. 7274.

* cited by examiner

*Primary Examiner* — Sonya D McCall Shepard
(74) *Attorney, Agent, or Firm* — Sughrue Mion, PLLC

(57) ABSTRACT

To improve the manufacturing yield of a semiconductor device, there is to provide a method of manufacturing a semiconductor device using a multilayer resist, in which before performing water repelling processing for immersion exposure on a wafer, an anti-reflection film, an underlayer film, and an intermediate film applied to a wafer edge portion are eliminated through rinse processing.

12 Claims, 13 Drawing Sheets

RELATION BETWEEN WAFER REAR SURFACE
POSITION AND CONTACT ANGLE OF RINSE LIQUID

SEMICONDUCTOR DEVICE MANUFACTURING METHOD USING A MULTILAYER RESIST

CROSS-REFERENCE TO RELATED APPLICATIONS

The disclosure of Japanese Patent Application No. 2015-033930 filed on Feb. 24, 2015 including the specification, drawings and abstract is incorporated herein by reference in its entirety.

BACKGROUND

The invention relates to a method of manufacturing a semiconductor device and more particularly, to the semiconductor device manufacturing method using a multilayer resist.

In the immersion exposure process mainly used after the 45 nm node process, dust generation from a wafer edge portion induces exposure failure and lens contamination of an exposure device, and generates a defect in an integrated circuit formed on a wafer, hence to deteriorate the manufacturing yield, which is an obvious problem (FIG. 12).

Therefore, at an immersion exposure time, in order to secure water repellency in a wafer edge portion, it is necessary to correctly apply a top coat material and a resist having the water repellency to the wafer surface including the wafer edge portion. Further, the water repelling processing such as HMDS processing (Hexamethyldisilazane) is required for the wafer surface that is a semiconductor substrate.

Further, according to the miniaturization, in order to suppress reflection from a semiconductor substrate, there is introduced the multilayer resist process such as a process of Bottom Anti Reflection Coating (BARC) that is an anti-reflection film and a coating typed process of Carbon Hard Mask (C-HM) including a silicon (Si)-containing intermediate layer having a function of both anti-reflection and etching resistance and a carbon based underlayer (FIG. 13).

In order to restrain dust generation from the wafer edge portions (particularly, bevel portions) of these organic films, dust elimination according to edge rinse, back rinse, and bevel rinse with various types of solvents at an application time of these organic films and elimination of the residues in the wafer edge portions caused by bevel etching and bevel polishing are considered, as the processing for the edge portion of the organic film.

In the bevel etching and the bevel polishing, however, there are fears such as film exfoliation at a time of forming a barrier metal film after substrate exposure, dust generation caused by an abnormal discharge at a time of forming an interlayer insulating film, and liquid leakage at a time of immersion exposure caused by substrate scart of the bevel portion.

Further, there remain many problems such as elimination property of the organic films and controllability of a cut surface in the edge portion, also in the edge rinse, back rinse, and bevel rinse with various types of solvents (FIG. 14).

As the background technique of this technical field, there is a technique, for example, as disclosed in Japanese Unexamined Patent Application Publication No. 2008-277748. This Patent Application Publication discloses a technique for HMDS processing just after the formation of a target film.

Further, Japanese Patent Application Publication No. 4897056 discloses a technique for water repelling processing by dropping a water repellent chemical liquid from a nozzle of an application device.

In the Proc. of SPIE, Vol. 7274, "Control and reduction of immersion defectivity for yield enhancement at high volume production" (72741P, written by Nakano, 2009), there are considered the optimization of the condition for the HMDS processing to be processed on a substrate, the effectiveness of pre-rinse processing before the immersion exposure processing, and the material having the water repellency.

In the Proc. of SPIE, Vol. 7274, "Defectivity Improvement by Modified Wafer Edge Treatment in Immersion Lithography" (72741G, written by Fujita, 2009), there are considered the dependency by the bevel shape of a wafer, the elimination property of BARC in the edge rinse and the bevel rinse with various types of solvents, and the controllability of the cut surface.

As mentioned above, in the manufacturing process of a semiconductor device, especially in the manufacturing process of a semiconductor device using the liquid immersion lithography, the prevention of the dust generation in the wafer edge portions during the immersion exposure process is the most important problem in order to improve the manufacturing yield.

The applicants of the invention consider a method of manufacturing a semiconductor device that is superior in the elimination property of the organic films and the controllability on the cut surface, in order to restrain the dust generation in the wafer edge portions at the immersion exposure time using the BARC process and the C-HM process.

Other problems and novel features will be apparent from this specification and the attached drawings.

SUMMARY

According to one embodiment, in a method of manufacturing a semiconductor device using a multilayer resist, a film applied to a wafer edge portion is eliminated by cleaning before the water repelling processing.

According to the embodiment, the manufacturing yield of the semiconductor device can be improved.

DETAILED DESCRIPTION

Figure 1:
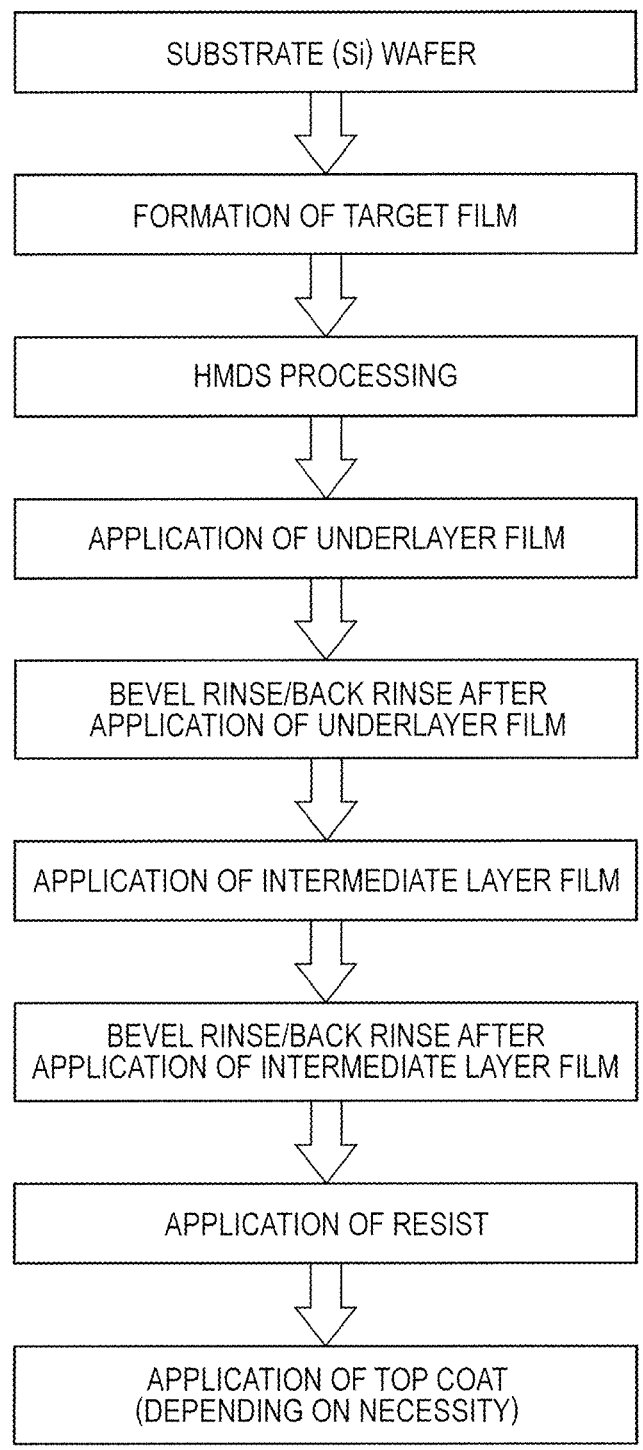
FIG. 1 is a flow chart illustrating a part of the general semiconductor device manufacturing process.

Hereinafter, embodiments of the invention will be described using the drawings. In the drawings, the same codes are attached to the same components and their detailed description of the overlapped portions is omitted.

First Embodiment

Figure 2:
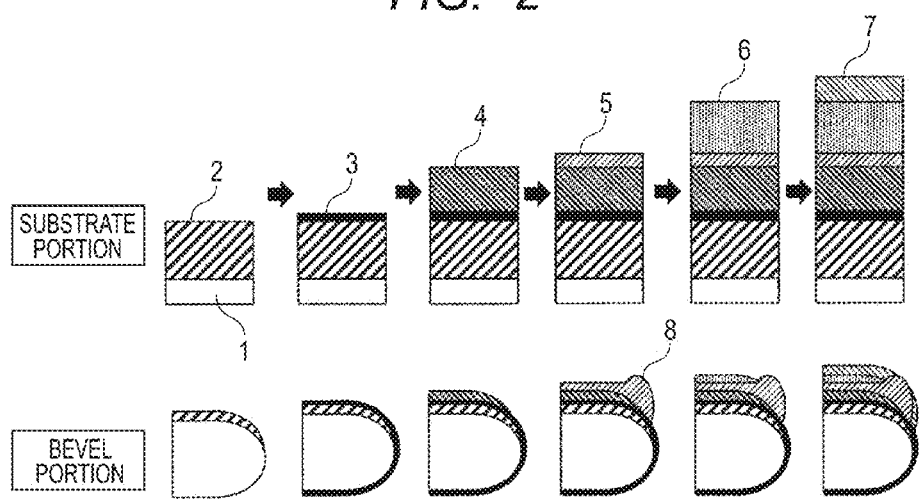
FIG. 2 is a partially cross-sectional view illustrating a part of the general semiconductor device manufacturing process.

At first, a general method of manufacturing a semiconductor device will be described according to FIGS. 1 to 3. FIG. 1 is a flow chart illustrating the process of forming a multilayer resist on a semiconductor substrate such as a silicon wafer where a target film is formed. FIG. 2 is a cross-sectional view of a wafer edge portion in each step of FIG. 1. Further, FIG. 3 is a cross-sectional view of the wafer edge portion when the target film is etched using the multilayer resist formed in the process illustrated in FIGS. 1 and 2.

Figure 3:
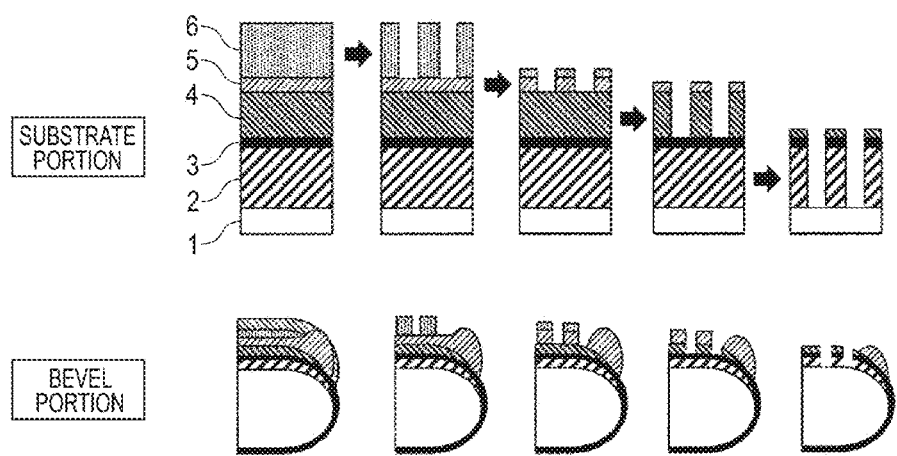
FIG. 3 is a partially cross-sectional view illustrating a part of the general semiconductor device manufacturing process.

The process illustrated in FIGS. 1 to 3 is the process using a carbon hard mask (C-HM) of an organic film coating type.

As illustrated in FIGS. 1 and 2, a target film 2 is formed on a silicon wafer 1 that is a semiconductor substrate. Then, the HMDS processing is performed on the target film 2, to form an HMDS processing layer 3. Continuously, an underlayer film 4 having the optical absorption performance on the exposure light from the exposure device for preventing the standing wave and the irregular reflection caused by the reflection from the substrate is applied by spin coat (application device). After applying the underlayer film 4 to the silicon wafer 1, an extra underlayer film 4 applied to the wafer edge portion is eliminated through the bevel rinse and the back rinse.

Then, an intermediate layer film 5 having the optical absorption performance on the exposure light from the exposure device for preventing the standing wave and the irregular reflection caused by the reflection from the substrate, similarly to the underlayer film 4, is applied by the application device. After applying the intermediate layer film 5, similarly to the underlayer film 4, an extra intermediate layer film 5 applied to the wafer edge portion is eliminated through the bevel rinse and the back rinse.

At last, a resist film 6 made of a photosensitive material is applied there. Depending on the necessity, further a top coat film 7 may be applied in some cases.

Figure 14:
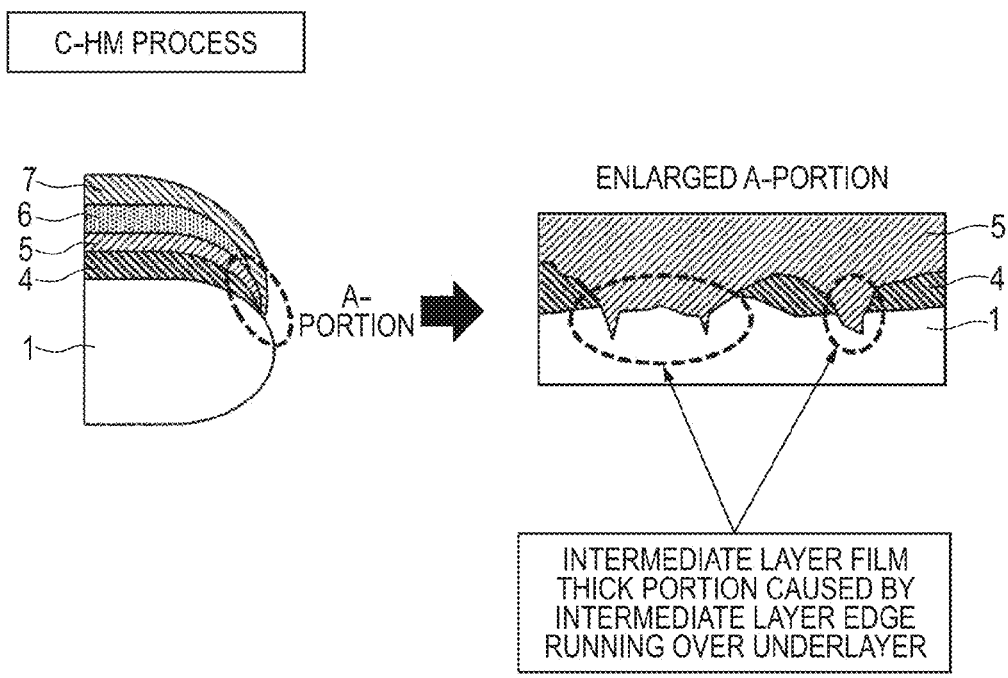
FIG. 14 is a view schematically illustrating the problem of the wafer edge portion.

As illustrated in FIG. 2, when a multilayer resist is formed on the silicon wafer 1 in the BARC process and the C-HM process, the controllability on the cut surfaces of various types of organic films such as the BARC film, the underlayer film, and the intermediate layer film is poor in the wafer edge portion; as the result, as illustrated in FIG. 14, the intermediate layer film 5 runs over the edge of the underlayer film 4, hence to generate a bulging portion 8 of the film called Hump in the bevel portion.

A process flow of processing (etching) the target film 2 with the multilayer resist formed as mentioned above will be described using FIG. 3.

The resist film 6 in the upmost layer of the multilayer resist formed according to the process flow indicated in FIGS. 1 and 2 is exposed to a resist pattern with an immersion exposure device and continuously developed on the intermediate layer film 5.

With a mask of the resist pattern formed on the intermediate layer film 5, the intermediate layer film 5 is etched. Generally, a silicon (Si)-containing polymer is often used for the intermediate layer film 5. Then, with a mask of the resist pattern and the etched intermediate layer, the underlayer film 4 is etched. At last, with a mask of the remaining intermediate layer 5 and the etched underlayer, the HMDS processing layer 3 and the target film 2 are etched.

As mentioned above, since the hump or the bulging portion 8 is formed in the bevel portion of the silicon wafer 1, the hump causes etching residue, resulting in the dust generation.

In the C-HM process, there are two coating types of an organic film and an inorganic film formed by the CVD. In the case of the inorganic film, an amorphous carbon film formed by the CVD is used as the underlayer film, and on the underlayer film, a silicon-based hard mask (silicon oxide film, silicon nitride film, and silicon nitrided oxide film) is formed by the CVD method in some cases.

When the intermediate layer formed by this inorganic film includes nitrogen atom, a resist pattern is occasionally formed into a draggle-tailed shape in the vicinity of the substrate of the intermediate layer when forming the resist pattern. In the case, in order to improve the resist shape, the BARC film is further formed on the intermediate layer in some cases.

Figure 4:
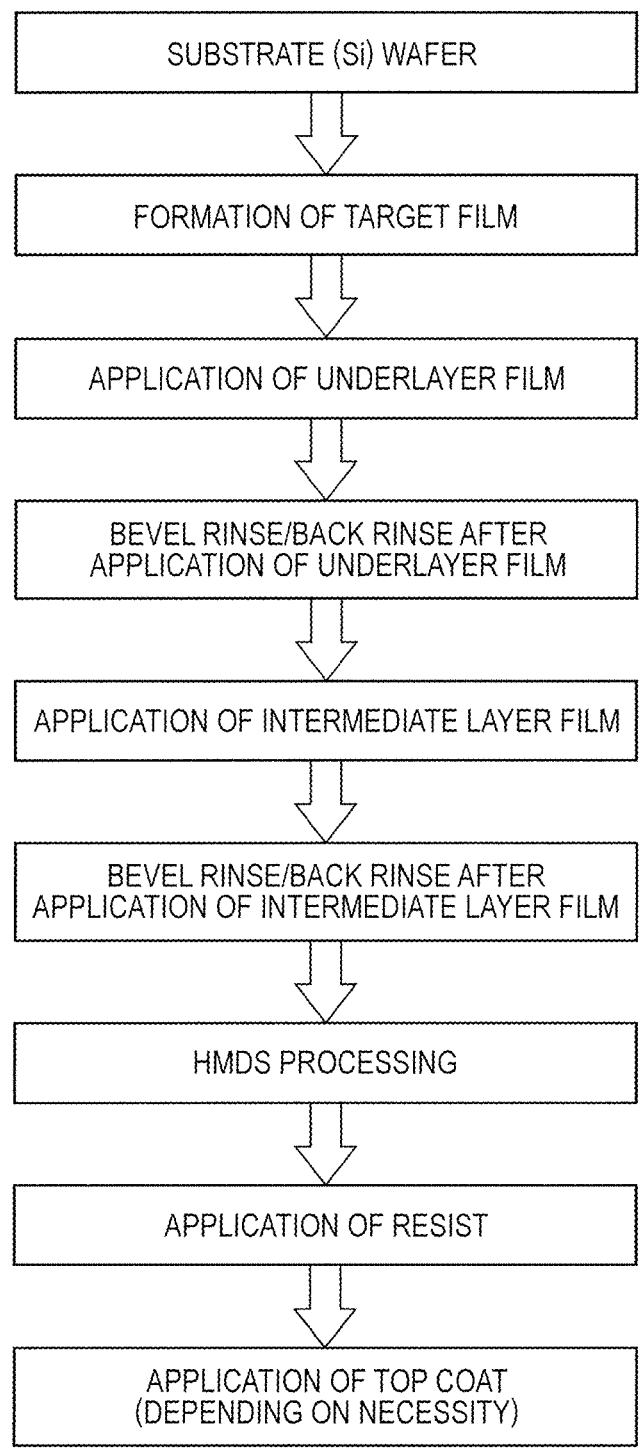
FIG. 4 is a flow chart illustrating a part of a semiconductor device manufacturing process according to one embodiment of the invention.
Figure 5:
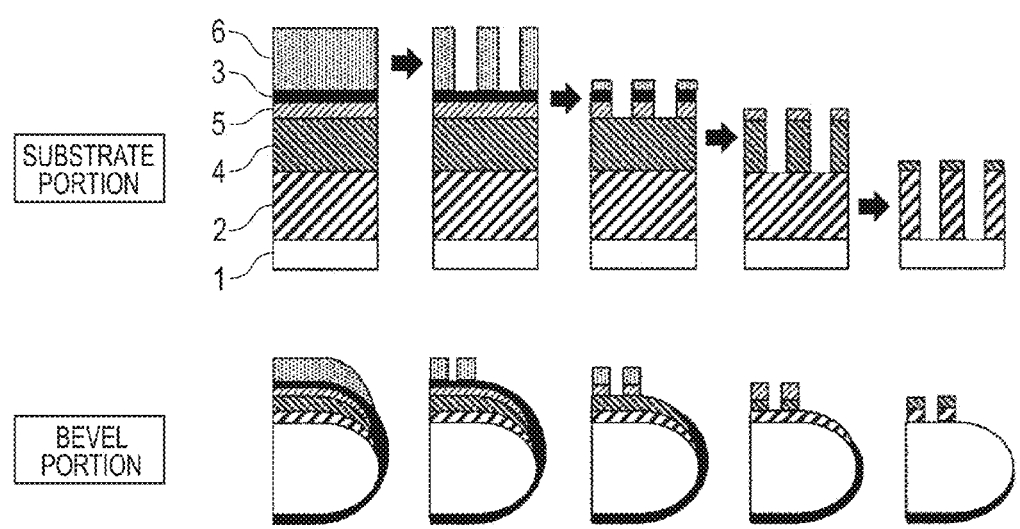
FIG. 5 is a partially cross-sectional view illustrating a part of the semiconductor device manufacturing process according to the embodiment of the invention.

Next, using FIGS. 4 and 5, a method of manufacturing a semiconductor device according to the embodiment will be described. FIG. 4 is a flow chart illustrating the process of forming a multilayer resist in the embodiment. FIG. 5 is a cross-sectional view of the wafer edge portion when etching the target film using the multilayer resist formed in the process illustrated in FIG. 4.

The process illustrated in FIGS. 4 and 5 is the process using the carbon hard mask (C-HM) of an organic film coating type, similarly to FIGS. 1 to 3.

As illustrated in FIG. 4, a target film is formed on a silicon wafer that is a semiconductor substrate. Then, an underlayer film for preventing the standing wave and the irregular reflection caused by the reflection from the substrate or a film for absorbing the above is applied by spin coat (application device). After applying the underlayer film to the silicon wafer, an extra underlayer film applied to the wafer edge portion is eliminated through the bevel rinse and the back rinse.

The underlayer film is formed by dissolving, for example, a polyhydroxystyrene based resin in a mixed solvent of ethyl lactate and propylene glycol monomethyl ether acetate (PGMEA), spin-coating (applying) the above with the film thickness in the range of 50 nm to 500 nm and then pre-baking the above at 150° C. to 400° C.

As the material of the underlayer film, such a resin compound may be used as a copolymer of polyhydroxystyrene and acrylic acid ester, a polyfluorene-containing material, a nortricyclene copolymer, a hydrogenated naphthol novolac resin, a naphthol dicyclopentadiene copolymer, a phenol dicyclopentadiene copolymer, a fluorene bisphenol novolac, an acenaphthylene copolymer, an indene copolymer, a phenolic group-containing fullerene, a bisphenol compound and its novolac resin, a novolac resin of adamantane phenol compound, a hydroxy vinyl naphthalene copolymer, a bisnaphthol compound and its novolac resin, Ring Opening Metathesis Polymerization (ROMP), and a tricyclopentadiene copolymer.

A copolymer resin of these and a polymer blended resin may be used but it is not restricted to these.

Thereafter, similarly to the underlayer film, the intermediate layer film for preventing the standing wave and the irregular reflection caused by the reflection from the substrate, or a film for absorbing the above is applied by an application device. After applying the intermediate layer film, similarly to the underlayer film, an extra intermediate layer film applied to the wafer edge portion is eliminated through the bevel rinse and the back rinse.

The intermediate layer film is formed by dissolving, for example, a silicon (Si)-containing polysilsesquioxan based material in the solvent of propylene glycol monomethyl ether, spin-coating (applying) the above with the film thickness in the range of 10 nm to 200 nm, and pre-baking the above at 80° C. to 300° C.

The material of the intermediate layer film may include a silsesquioxan based silicon compound and it may have an anti-reflection function and silicon such as a siloxane resin; but, it is not restricted to these. The material containing a silicon component is used for the intermediate layer film, hence to improve the etching tolerance.

Then, the HMDS processing is performed on the intermediate layer film, to form an HMDS processing layer. This HMDS processing is performed by introducing a nitrogen ($N_2$) gas into HMDS liquid and transferring the HMDS by the nitrogen gas, in short, by a gas phase introduction method. When using the gas phase introduction method, more even HMDS processing can be performed on the wafer surface.

Finally, a resist film made of a photosensitive material is applied on the HMDS processing layer. Depending on the necessity, a top coat film 7 is further applied there in some cases.

As mentioned above, by performing the HMDS processing just before the application of the resist, the controllability in the bevel portion in the underlayer and the intermediate layer is improved, as illustrated in the cross-sectional view of the wafer edge portion at the leftmost side of FIG. 5, and the generation of the hump in the underlayer and the intermediate layer can be suppressed.

Generally, the HMDS processing intrudes to the rear surface of the wafer; therefore, in the back rinse and the bevel rinse with various types of solvents at the organic film application time in the C-HM process, the rinse liquid does not evenly run around the bevel portion, which generates the irregularity on the cut surface of the organic film and causes the hump of the bevel portion.

On the other hand, in the C-HM process in the embodiment, the rinse liquid can run around the bevel portion evenly in the back rinse and the bevel rinse with various types of solvents at the application time of the underlayer and the intermediate layer.

In short, as illustrated in FIG. 4, after the rinse processing (the back rinse and the bevel rinse) after the intermediate layer formation, the HMDS processing is performed in order to secure the water repellency in the wafer bevel portion at the immersion exposure time; thereby preventing the irregularity on the cut surface of the organic film and the generation of the hump.

As the rinse liquid for use in the edge rinse, the back rinse, and the bevel rinse, for example, cyclohexanone is used. As the rinse liquid, as far as it can dissolve the underlayer and the intermediate layer, various materials may be used as follows: ketone such as methyl-2-amyl ketone; alcohols such as 3-methoxy butanol, 3-methyl-3-methoxy butanol, 1-methoxy-2-propanol, and 1-ethoxy-2-propanol; ethers such as propylene glycol monomethyl ether, ethylene glycol monomethyl ether, propylene glycol monoethyl ether, echylene glycol monoethyl ether, propylene glycol dimethyl ether, and diethylene glycol dimethyle ether; and esters such as propylene glycol monomethyl ether acetate, propylene glycol monoethyl ether acetate, ethyl lactate, ethyl pyruvate, butyl acetate, 3-methoxypropionic acid ethyl methyl, 3-ethoxypropanoic acid ethyl ester, tert-butyl acetate, propionic acid tert-butyl ester, propylene glycol monomethyl ether acetate, and propylene glycol mono-tert-butyl ether acetate.

Further, two or more types of these may be mixed and it is not restricted to these.

The resist film applied on the HMDS processing layer is formed by spin-coating (applying), for example, a chemical amplification type ArF resist with the film thickness in the range of 50 nm to 200 nm and then pre-baking the above at 80° C. to 150° C.

According to FIG. 5, a process flow for processing (etching) a target film using the multilayer resist formed as mentioned above will be described.

A silicon wafer 1 that is a semiconductor substrate with various kinds of organic films applied according to the process illustrated in FIG. 4 is exposed by an ArF immersion exposure device and then, subjected to the Post Exposure Bake (PEB) processing at 100° C. to 150° C. Continuously, the development processing is performed with alkali development liquid of about 2.38%, hence to form a predetermined pattern on the resist film 6.

With a mask of the resist pattern formed on the HMDS processing layer 3, the HMDS processing layer 3 and the intermediate layer film 5 are etched. The remaining HMDS processing layer 3 and the processed intermediate layer film 5 are used as a mask to etch the underlayer film 4. At last, the remaining intermediate layer film 5 and the processed underlayer film 4 are used to etch the target film 2.

A fron family gas is used for etching the intermediate layer film 5 and the resist pattern is used as a mask to process the intermediate layer film 5. For etching of the underlayer film 4, in addition to the oxygen ($O_2$) gas or hydrogen ($H_2$) gas, an inert gas such as a helium (He) gas and an argon (Ar) gas, carbon monoxide (CO), carbon dioxide ($CO_2$), ammonia ($NH_3$), sulfur dioxide ($SO_2$), nitrogen ($N_2$), nitrogen dioxide ($NO_2$), and hydrogen ($H_2$) gas can be added.

Alternatively, instead of using the oxygen ($O_2$) gas or the hydrogen ($H_2$) gas, only the CO, $CO_2$, $NH_3$, $SO_2$, $N_2$, and $NO_2$ gas can be used to do the etching.

The target film can be also etched according to the conventional method: when the target film formed on a semiconductor substrate is a silicon oxide film ($SiO_2$), a silicon nitride film (SiN), or a silica-based insulating film of low dielectric constant, a fron family gas is mainly used to do the etching; when the target film is a polysilicon (Poly-Si), aluminum (Al), or tungsten (W), a chlorine (Cl) based gas or a bromine (Br) based gas is mainly used to do the etching.

Figure 7:
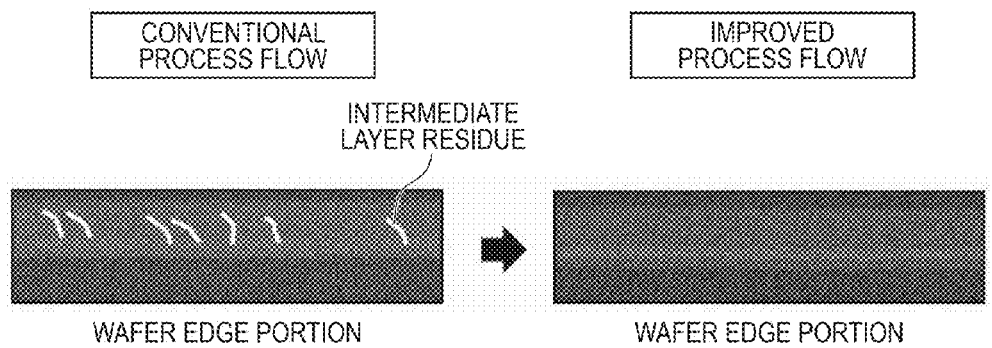
FIG. 7 is a view schematically illustrating a wafer edge portion.

The state of the edge portion (bevel portion) of the wafer formed according to the C-HM process in the embodiment as mentioned above is illustrated in FIG. 7. FIG. 7 is a view illustrating the bevel portion with the traced photomicrographs, being observed with an optical microscope, for clear understanding.

In the general C-HM process, there occurs the etching residue (intermediate layer film residue) caused by the hump of the intermediate layer (bulging portion of the film in the bevel portion); however, according to the embodiment, it is found that the etching residue (intermediate layer film residue) is resolved.

By performing the HMDS processing just before the resist application, as illustrated in FIG. 5, the controllability in the bevel portion in the underlayer film 4 and the intermediate layer film 5 can be improved and the generation of the hump in the underlayer film 4 and the intermediate layer film 5 can be suppressed. As the result, it is possible to form a wafer bevel portion free from the generation of the etching residue (intermediate layer film residue) after the etching.

The reason why the formation of the hump (bulging portion) in the wafer edge portion can be restrained will be described in detail according to the manufacturing process in the embodiment.

As illustrated in FIGS. 1 and 2, in order to secure the water repellency in the wafer bevel portion at the immersion exposure time, in the conventional art, the HMDS processing that is an adhesion reinforcing material is first performed on a wafer substrate; however, in the embodiment, as illustrated in FIG. 4, the HMDS processing is performed on the wafer substrate, after the application of the intermediate layer according to the C-HM process and just before the resist application; therefore, the controllability on the cut surfaces of the organic films such as the underlayer film and the intermediate layer film can be improved and the hump generation can be suppressed. In short, the rinse processing (back rinse and bevel rinse) of the organic films such as the underlayer film and the intermediate layer film is performed before the water repelling processing such as the HMDS processing.

As mentioned above, when using the immersion exposure, in order to secure the water repellency in the wafer bevel portion, the HMDS processing is performed on the wafer (semiconductor substrate); however, in the HMDS processing, the HMDS liquid intrudes to the rear surface of the wafer.

Figure 8:
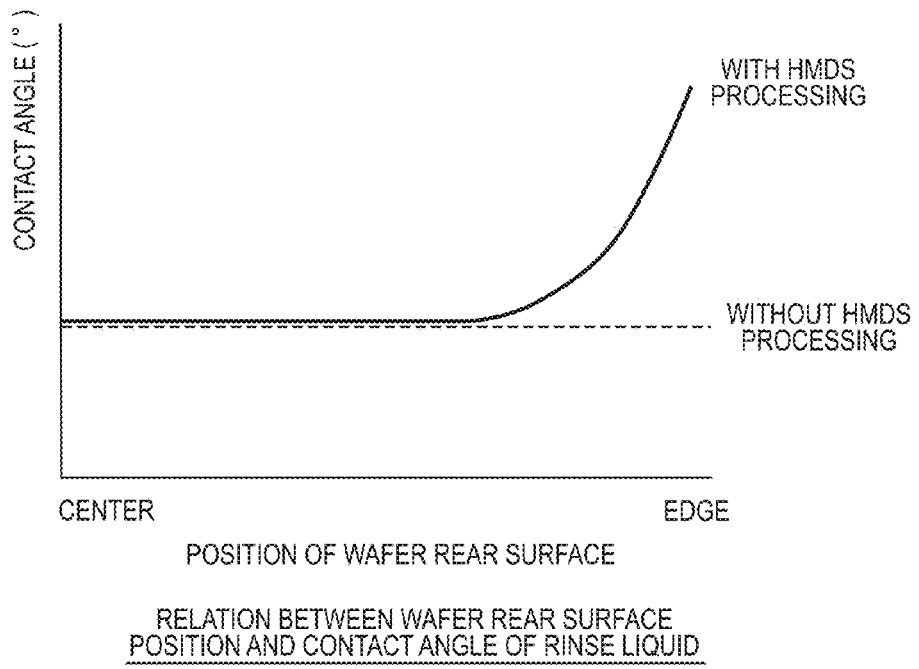
FIG. 8 is a graph indicating a relation between the rear surface position of the wafer and the contact angle of a rinse liquid.
Figure 9:
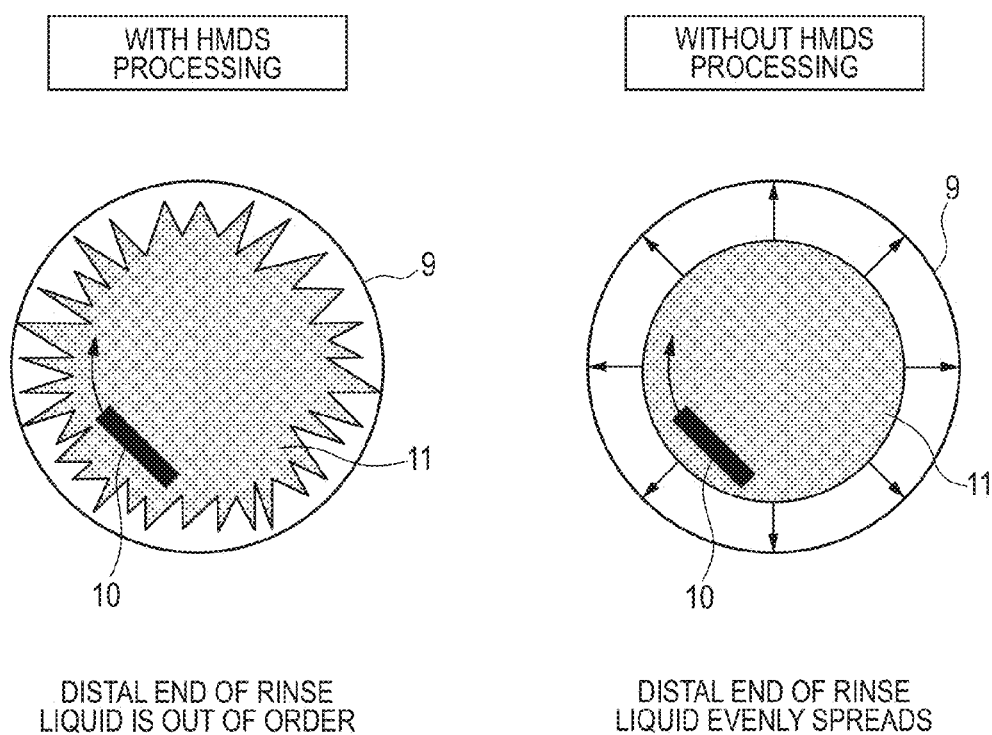
FIG. 9 is a view schematically illustrating how the rinse liquid flows on the rear surface of a wafer.

FIG. 8 illustrates a contact angle with a rinse liquid on the rear surface of the wafer having been HMDS processed. It is known that the contact angle gets higher because the HMDS intrudes to the rear surface from the wafer edge by about 60 mm. Therefore, the rinse liquid is easily repelled and as illustrated in FIG. 9, the rinse liquid does not spread evenly on the rear surface of the wafer during the back rinse and the bevel rinse; as the result, irregularity occurs on the cut surfaces of the organic films such as the underlayer film and the intermediate layer film in the C-HM process.

In the embodiment, since the HMDS processing is not performed at a time of the rinse processing (back rinse and bevel rinse) after the application of the C-HM underlayer and intermediate layer, the rinse liquid evenly spreads on the rear surface of the wafer, hence to improve the controllability on the cut surfaces of various types of the organic films and to suppress the hump generation.

As mentioned above, according to the semiconductor device manufacturing method in the embodiment, by performing the HMDS processing on the wafer substrate after the application of the organic film in the C-HM process, the controllability on the cut surfaces of the organic films can be improved and the hump generation can be effectively suppressed. Therefore, generation of the polymer residues and the film residues after the etching caused by the generation of the hump in the bevel portion at the application of various types of the organic films can be suppressed, thereby preventing the dust generation from the wafer edge. According to this, in the semiconductor device manufacturing process, the manufacturing yield or the process yield can be improved.

Second Embodiment

Figure 6:
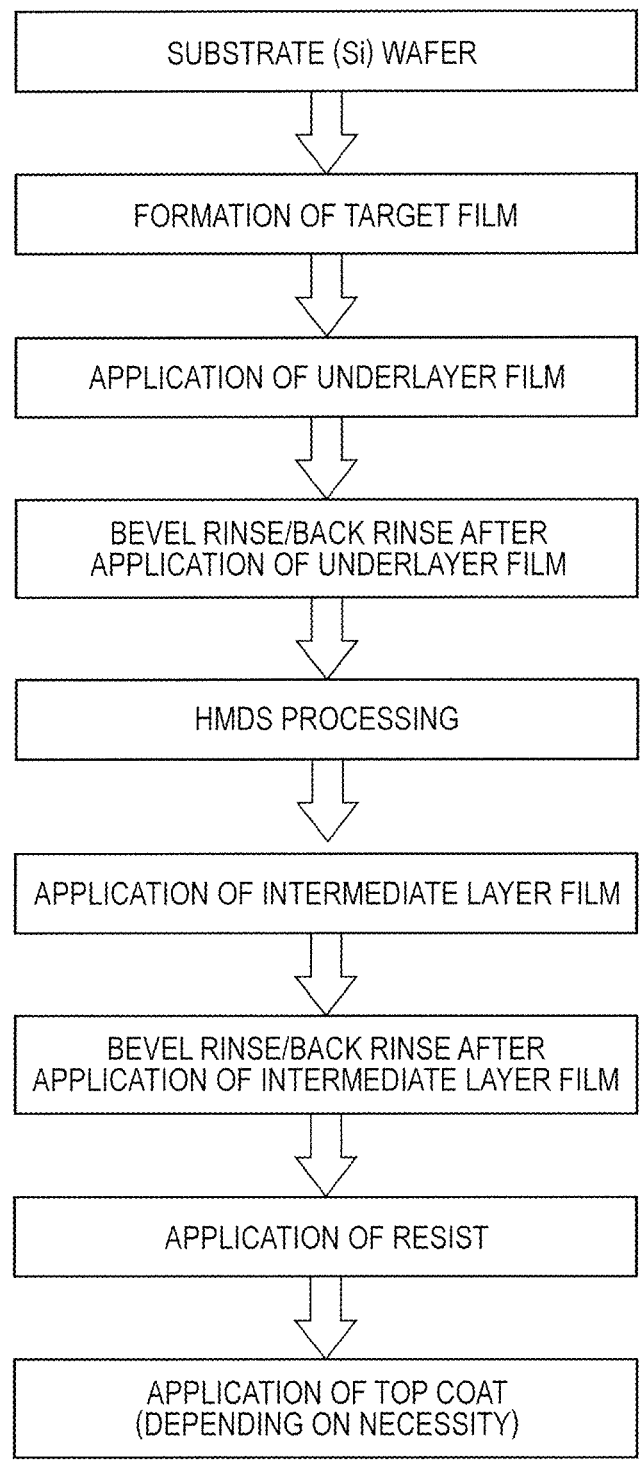
FIG. 6 is a flow chart illustrating a part of a semiconductor device manufacturing process according to another embodiment of the invention.

A method of manufacturing a semiconductor device according to a second embodiment will be described according to FIG. 6. FIG. 6 is a flow chart illustrating the process of forming a multilayer resist in the embodiment. According to the first embodiment, as illustrated in FIG. 4, in the C-HM process, the HMDS processing that is the water repelling processing is performed after the application of the underlayer film and the intermediate layer film. On the other hand, in this embodiment, as illustrated in FIG. 6, the HMDS processing is performed after the back rinse and the bevel rinse after the application of the underlayer film and before the application of the intermediate layer film, differently from the process flow of the first embodiment.

As illustrated in FIG. 14, in the conventional C-HM process, the edge of the intermediate layer film 5 runs over the edge of the underlayer film 4 to form a film thick portion in the intermediate layer film, which becomes the hump in the wafer edge portion.

As mentioned above, by performing the HMDS processing, after the back rinse and the bevel rinse after the application of the underlayer film, and before the application of the intermediate layer film, the controllability on the cut surface in the bevel portion of the underlayer film can be improved and the formation of the hump (bulging portion) in the wafer edge portion can be suppressed.

Third Embodiment

Figure 10:
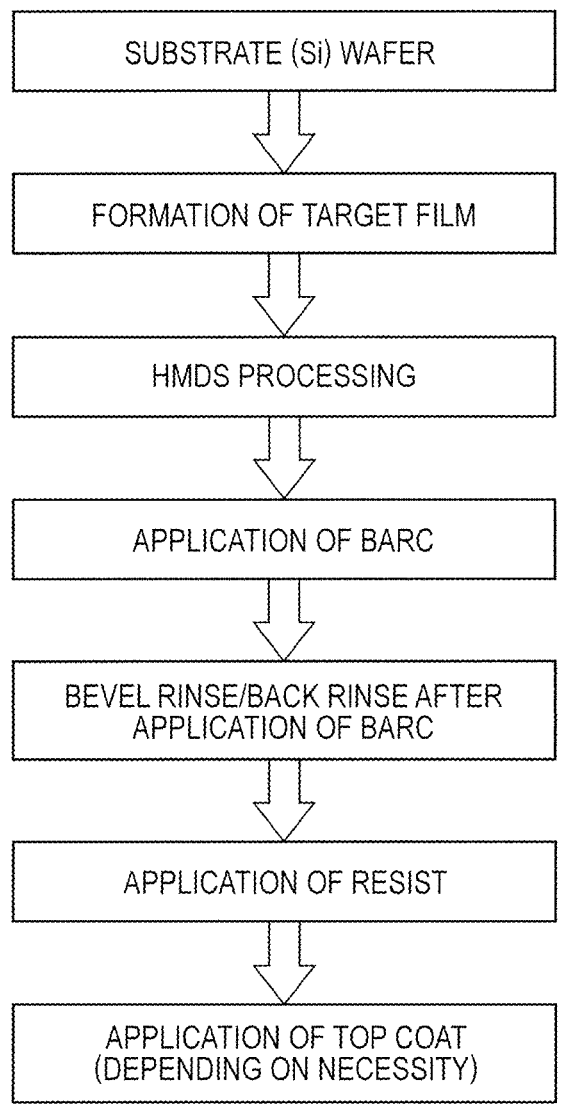
FIG. 10 is a flow chart illustrating a part of the general semiconductor device manufacturing process.
Figure 11:
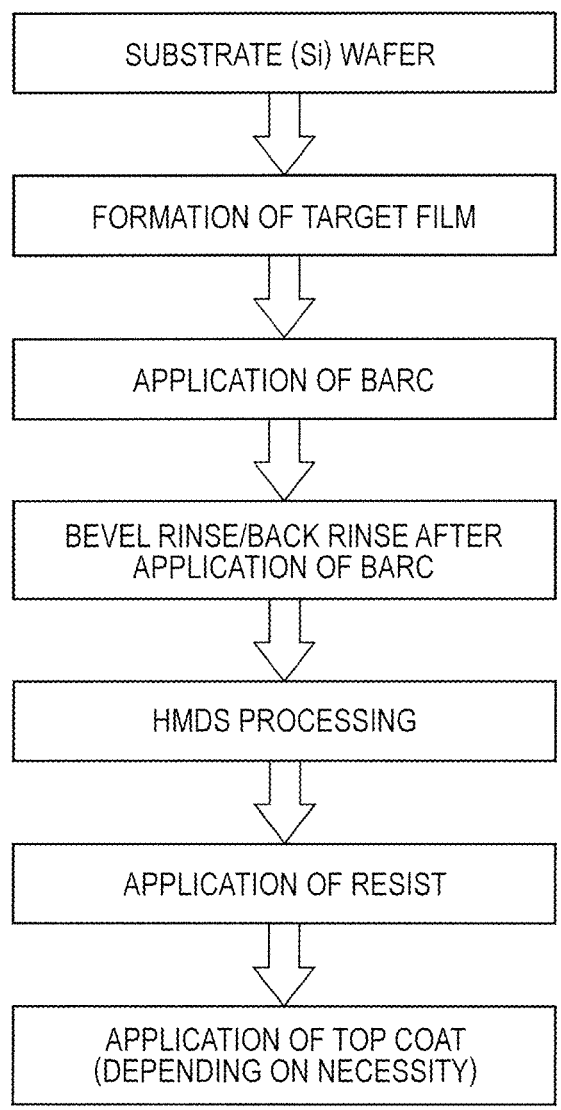
FIG. 11 is a flowchart illustrating apart of a semiconductor device manufacturing process according to another embodiment of the invention.
Figure 12:
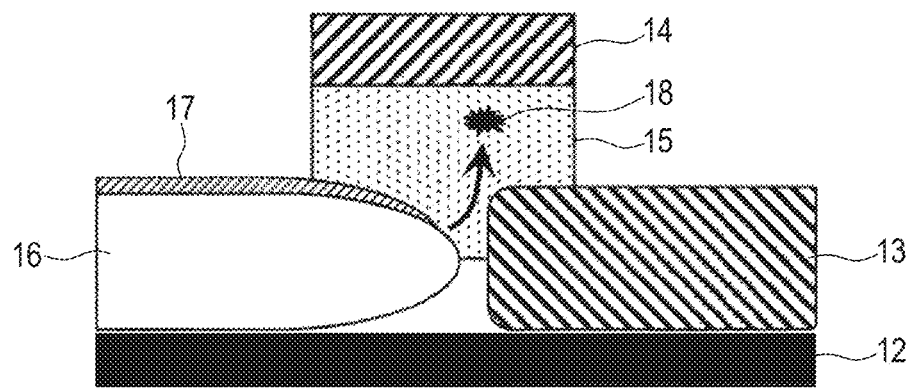
FIG. 12 is a view schematically illustrating the problem of the immersion exposure process.
Figure 13:
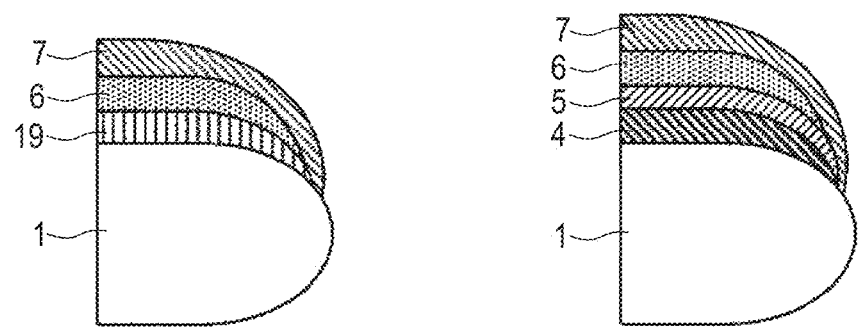
FIG. 13 is a partially cross-sectional view schematically illustrating the wafer edge portion.

A method of manufacturing a semiconductor device according to a third embodiment will be described according to FIGS. 10 and 11. FIG. 10 illustrates the general semiconductor device manufacturing process using the BARC, and FIG. 11 illustrates the semiconductor device manufacturing process using the BARC according to the embodiment.

In the conventional semiconductor device manufacturing process, the HMDS processing is performed on a wafer substrate before forming the BARC organic film, in order to secure the water repellency in the wafer bevel portion also at the immersion exposure time when the organic BARC film is applied to a substrate made of an inorganic material (a substrate made by the inorganic C-HM process in which inorganic amorphous carbon ($\alpha$-C) is used for the underlayer and an inorganic anti-reflection film such as a silicon oxide film (SiO film), a silicon nitride film (SiN film), and a silicon oxide nitride film (SiON film) is used for the intermediate layer according to the and by the process in combination of the organic underlayer containing lots of carbon such as novolac resin and the inorganic $SiO_2$, according to the CVD method and the Atomic Layer Deposition (ALD) method, and a substrate made by the process by combination of an inorganic underlayer containing much carbon such as a novolic resin and an inorganic $SiO_2$ film).

As illustrated in FIG. 10, in the conventional BARC process, a target film is formed on a silicon wafer that is a semiconductor substrate. Then, the HMDS processing is performed on the target film to form an HMDS processing layer. Continuously, a BARC film having an optical absorption performance on the exposure light from an exposure device to prevent the standing wave and the irregular reflection caused by the reflection from the substrate is applied by spin coat (application device). After the application of the BARC film to the silicon wafer, an extra BARC film applied to the wafer edge portion is eliminated through the bevel rinse and the back rinse.

At last, a resist film made of a photosensitive material is applied there. Depending on the necessity, further a top coat film may be applied in some cases.

In the above mentioned conventional BARC process, as illustrated in FIG. 10, the HMDS processing is performed on the wafer surface before the application of the BARC film to the wafer; therefore, as having been described in FIG. 9, the rinse liquid does not evenly spread on the rear surface of the wafer in the rinse processing (the back rinse and the bevel rinse) after the application of the BARC, which causes the irregularity on the cut surface of the BARC film. According to this, film exfoliation occurs in the wafer edge portion.

On the other hand, in the embodiment, as illustrated in FIG. 11, the HMDS processing is performed after the rinse processing (the back rinse and the bevel rinse) after the application of the BARC film, and before the application of the resist; therefore, the controllability on the cut surface in the bevel portion of the BARC film can be improved and the formation of the hump (bulging portion) in the wafer edge portion can be suppressed. As the result, film exfoliation in the wafer edge portion can be prevented and the manufacturing yield and the process yield of a semiconductor device can be improved.

As the BARC for use in the general ArF lithography, ARC-29A and ARC-93 (manufactured by Nissan Chemical Industries, Ltd), AR-40 (manufactured by Rohm & Hass Co.) are taken for instance but the other BARC may be used. The film is formed through spin coating with the film thickness in the range of 30 nm to 100 nm and then pre-baking at 150° C. to 300° C.

Fourth Embodiment

Figure 15:
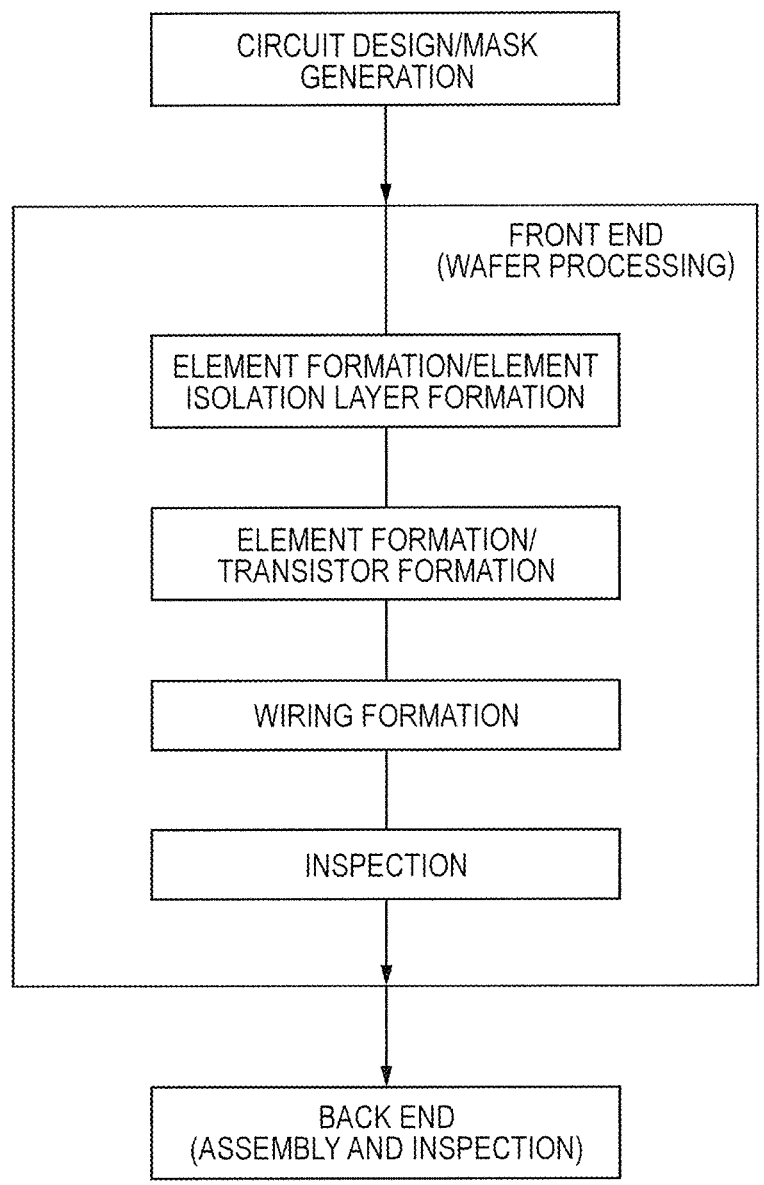
FIG. 15 is a flow chart illustrating the outline of the semiconductor device manufacturing process.
Figure 16:
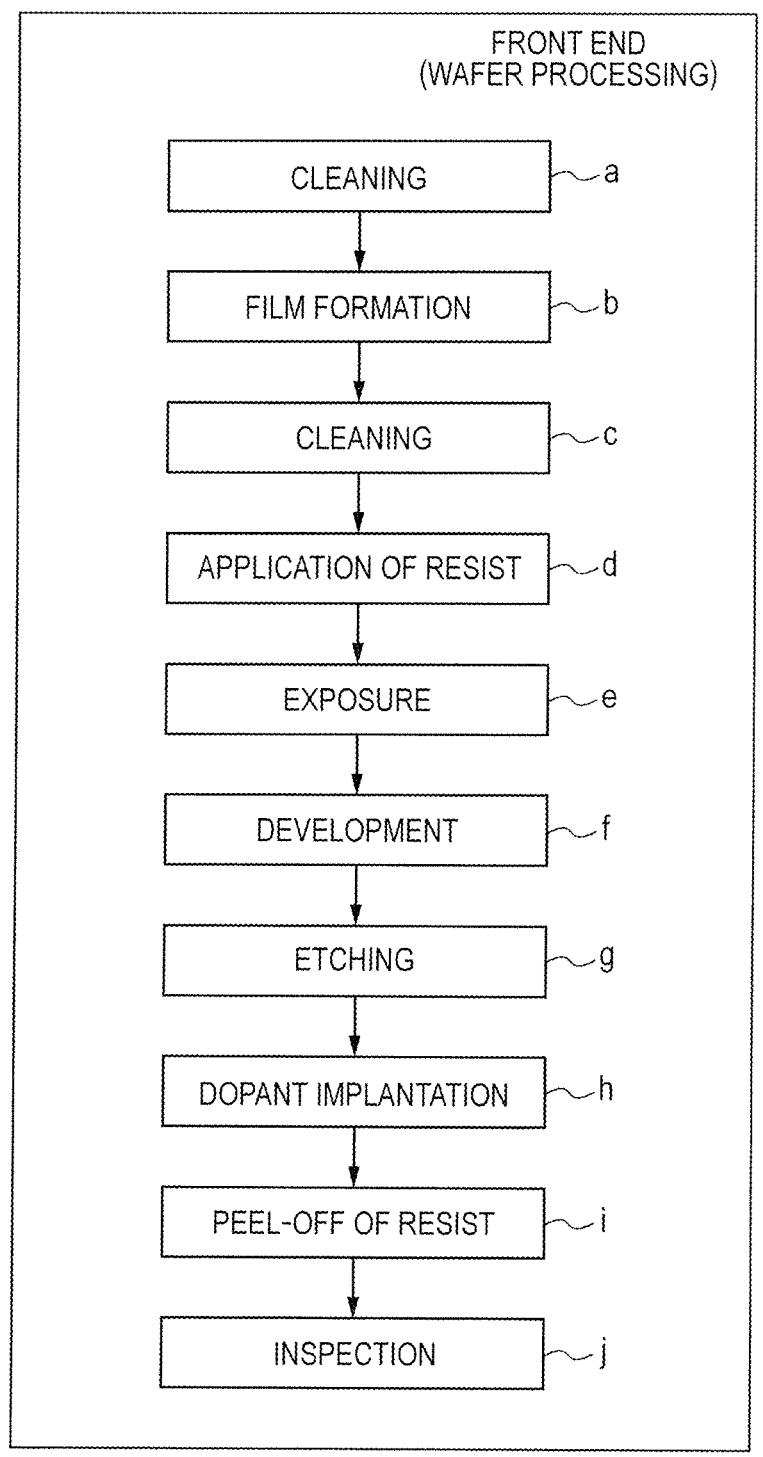
FIG. 16 is a flow chart illustrating the outline of the front end of the semiconductor device manufacturing process.

A method of manufacturing a semiconductor device such as a micro processor and a memory according to the process flow having been described in the first to the third embodiments will be described according to FIGS. 15 and 16. FIG. 15 is a flow chart illustrating the outline of the semiconductor device manufacturing process. Further, FIG. 16 is a flow chart illustrating the outline of the front end of the semiconductor device manufacturing process.

The manufacturing process of the semiconductor device such as a micro processor and a memory is roughly divided in three stages, as illustrated in FIG. 15.

At first, a semiconductor circuit is designed and a mask is created based on the circuit design.

Next, in the stage of the wafer processing called a front end, an integrated circuit is formed by repeatedly performing various kinds of surface processing on the surface of a semiconductor substrate (wafer) such as silicon. This front end is roughly divided into the process of forming elements and element isolation layers, the process of forming the elements and transistors, the wiring forming process of forming wirings among the elements and the transistors, and the process of inspecting the completed wafer, as illustrated in FIG. 15.

Further, in the back end, the wafer with the integrated circuit formed on the surface is individually separated, assembled as a semiconductor device, and checked.

In the front end of the wafer processing, several steps of surface processing are repeated from the step a to the step j as illustrated in FIG. 16.

At first, the surface of a wafer that is a semiconductor substrate is cleaned to eliminate the foreign substance and impurity attached to the wafer surface (step a).

Then, using a CVD device, a thin film is formed on the wafer surface. This thin film is a film for forming an interlayer insulating film such as a silicon oxide film and a wiring such as an aluminum film (step b).

After forming the thin film on the wafer surface, the foreign substance and impurity attached to the surface is again eliminated through cleaning (step c).

A resist material made of a photosensitive material is applied on the wafer with a film for forming the interlayer insulating film and the wiring formed on its surface (step d).

A circuit pattern is transferred to the resist by an exposure device using a mask with a desired circuit pattern formed there (step e).

In the developing processing, an unnecessary resist is eliminated to form a desired circuit pattern on the resist on the wafer (step f).

The resist with the desired circuit pattern formed is used as an etching mask to eliminate an unnecessary portion of the thin film formed on the wafer, by a dry etching device, hence to forma desired circuit pattern on the thin film (step g).

Thereafter, depending on the necessity, dopant is implanted on the wafer surface by an ion implantation device (step h).

The resist formed on the wafer is peeled off (eliminated) through asking processing and cleaning (step i).

Finally, the presence of the foreign substance on the wafer and whether or not the desired circuit pattern is accurately formed are checked by a foreign substance inspection device and an appearance inspection device (step j).

In the above steps from a to j, processing such as cleaning and drying is performed on the wafer depending on the necessity.

In the semiconductor device manufacturing method according to the embodiment, a multilayer resist formed in the BARC process and the C-HM process having been described in the first to the third embodiments is applied to the above step d and in the exposure process of the step e, the exposure processing is performed by using the immersion exposure device.

As mentioned above, by applying the process flow having been described in the first to the third embodiments to the manufacturing process of a semiconductor device such as a micro processor and a memory, the manufacturing yield and the process yield can be improved.

In the semiconductor device manufacturing process, since several steps of the surface processing illustrated in FIG. 16 are repeated several times, the film exfoliation and foreign substance caused by the formation of the hump (bulging portion) in the wafer edge portion affects the manufacturing devices used not only in the exposure process (step e) but also in the other steps such as the cleaning process (step a), the film formation process (step b), and the etching process (step g).

As mentioned above, by applying the process flow of the first to the third embodiments to the semiconductor device manufacturing process, dust generation can be suppressed in the semiconductor manufacturing devices used in the semiconductor manufacturing process.

As set forth hereinabove, the invention made by the inventor et al. has been concretely described based on the embodiments; however, the invention is not restricted to the above embodiments and needless to say, various modifications can be made in the range without departing from the spirit.

What is claimed is:

1. A method of manufacturing a semiconductor device comprising the following steps of:
    (a) preparing a semiconductor wafer comprised of a top surface, a rear surface opposite to the top surface, and a lateral surface between the top surface and the rear surface;
    (b) forming a target film on the top surface of the semiconductor wafer;
    (c) applying a first insulating layer that is a first mask film on the top surface and the lateral surface of the semiconductor wafer to cover the target film;
    (d) eliminating a part of the first insulating layer formed on the lateral surface of the semiconductor wafer, by cleaning the semiconductor wafer;
    (e) performing water repelling processing on the first insulating layer, after the step (d);
    (f) applying a second insulating layer that is a second mask film on the semiconductor wafer, after the step (e);
    (g) transferring a predetermined pattern to the second insulating layer according to photolithography, to form the second mask film;
    (h) transferring the pattern of the second mask film to the first insulating layer, to form the first mask film; and
    (i) etching the target film, using the first mask film.

2. The method according to claim 1,
    wherein the first insulating layer is a composite film including at least two layers of an underlayer film and an intermediate layer film.

3. The method according to claim 2,
    wherein the intermediate layer film includes a silicon component.

4. The method according to claim 1,
    wherein the first insulating layer is a light absorption film.

5. The method according to claim 1,
    wherein immersion exposure is used for the photolithography in the step (g).

6. The method according to claim 1,
    wherein the water repelling processing is HMDS processing according to a gas phase introduction method.

7. The method according to claim 1,
    between the step (e) and the step (f), further including the following steps of:
    (j) applying a third insulating layer that is a third mask film on the semiconductor wafer; and
    (k) eliminating a part of the third insulating layer formed on the lateral surface of the semiconductor wafer, by cleaning the semiconductor wafer.

8. The method according to claim 7,
    wherein the third insulating layer includes a silicon component.

9. A method of manufacturing a semiconductor device comprising the following steps of:
    (a) preparing a semiconductor wafer comprised of a top surface, a rear surface opposite to the top surface, and a lateral surface between the top surface and the rear surface;
    (b) forming a target film on the top surface of the semiconductor wafer;
    (c) applying a first insulating layer on the top surface and the lateral surface of the semiconductor wafer to cover the target film;
    (d) eliminating a part of the first insulating layer applied on the lateral surface of the semiconductor wafer by cleaning;
    (e) performing water repelling processing on the first insulating layer, after the step (d);
    (f) applying a second insulating layer on the semiconductor wafer, after the step (e);
    (g) transferring a predetermined pattern to the second insulating layer according to photolithography to form a mask film; and
    (h) etching the first insulating layer and the target film using the mask film.

10. The method according to claim 9,
    wherein the first insulating layer is a light absorption BARC film.

11. The method according to claim 9,
    wherein immersion exposure is used for the photolithography in the step (g).

12. The method according to claim 9,
    wherein the water repelling processing is HMDS processing according to a gas phase introduction method.

* * * * *